United States Patent [19]

Abrami et al.

[11] Patent Number: 5,539,186
[45] Date of Patent: Jul. 23, 1996

[54] TEMPERATURE CONTROLLED MULTI-LAYER MODULE

[75] Inventors: Anthony J. Abrami, Poughkeepsie; Maurizio Arienzo, Chappaqua; Giulio DiGiacomo, Hopewell Junction; Gene J. Gaudenzi, Purdys; Paul V. McLaughlin, Rhinebeck, all of N.Y.

[73] Assignee: International Business Machines Corporation, Armonk, N.Y.

[21] Appl. No.: 988,078

[22] Filed: Dec. 9, 1992

[51] Int. Cl.$^6$ .................................................. H05B 3/02
[52] U.S. Cl. .......................... 219/548; 219/543; 338/312; 338/314; 338/292; 174/262; 361/795
[58] Field of Search ............................ 219/548, 543, 219/550, 541, 203; 338/312, 307–309, 314, 306, 211, 295, 292; 174/262–266; 361/778, 792, 795

[56] References Cited

U.S. PATENT DOCUMENTS

| | | | |
|---|---|---|---|
| 2,876,393 | 3/1959 | Tally et al. | 219/543 |
| 3,440,407 | 4/1969 | Goltsos et al. | 219/494 |
| 3,475,588 | 10/1969 | McMaster | 219/203 |
| 3,584,189 | 6/1971 | Marcoux et al. | 219/209 |
| 3,684,858 | 8/1972 | Buck | 219/543 |
| 3,710,195 | 1/1973 | Sada et al. | 338/309 |
| 3,775,725 | 11/1973 | Endo | 338/308 |
| 4,298,770 | 11/1981 | Nishihara et al. | 174/262 |
| 4,374,316 | 2/1983 | Inamori et al. | 219/209 |
| 4,434,321 | 2/1984 | Betts | 174/266 |
| 4,481,403 | 11/1984 | DelMonte | 219/209 |
| 4,506,139 | 3/1985 | Daughton | 219/209 |
| 4,582,975 | 4/1986 | Daughton | 219/209 |
| 4,644,141 | 2/1987 | Hagen et al. | 219/543 |
| 4,652,974 | 3/1987 | Ryan | 361/395 |
| 4,663,497 | 5/1987 | Reimann | 174/264 |
| 4,706,165 | 11/1987 | Takenaka et al. | 361/403 |
| 4,733,056 | 3/1988 | Kojima et al. | 219/543 |
| 4,769,525 | 9/1988 | Leatham | 219/209 |
| 4,788,404 | 11/1988 | Kent . | |
| 4,870,746 | 10/1989 | Klaser | 29/620 |
| 4,901,051 | 2/1990 | Murata et al. | 338/308 |
| 4,931,354 | 6/1990 | Wakino et al. | 174/266 |
| 5,010,233 | 4/1991 | Henschen et al. | 219/209 |
| 5,155,340 | 10/1992 | Morita et al. | 219/543 |
| 5,164,699 | 11/1992 | Smith et al. | 338/308 |
| 5,218,761 | 6/1993 | Maniwa et al. | 174/266 |
| 5,229,550 | 7/1993 | Bindra et al. | 174/262 |
| 5,243,144 | 9/1993 | Ogino et al. | 174/262 |
| 5,468,936 | 11/1995 | Deevi et al. | 219/543 |

FOREIGN PATENT DOCUMENTS

| | | | |
|---|---|---|---|
| 52-26641 | 2/1977 | Japan | 219/543 |

*Primary Examiner*—John A. Jeffery
*Attorney, Agent, or Firm*—Whitham, Curtis, Whitham & McGinn; Aziz M. Ahsan

[57] ABSTRACT

A multi-layer module that has incorporated therein an additional sheet with a heat generating film resistor formed thereon. A temperature responsive controller regulates the film resistor current in order to regulate the temperature at the surface of the module. The invention is applicable to both single chip and multiple chip modules, and for multichip modules a plurality of discrete film resistors on a single may be used.

13 Claims, 3 Drawing Sheets

TEMPERATURE CONTROLLED MULTI-LAYER MODULE

BACKGROUND OF THE INVENTION

1. Field of the Invention

This invention relates to multi-layer modules that provide physical support and electrical connection to a very large-scale integrated circuit chip or chips mounted thereon by means of a dense array of via connectors, and more particularly, to an improved module that includes a heater to control the module surface temperature.

2. Description of the Prior Art

As will be appreciated by those skilled in the art, multi-layer modules are used to mechanically support and electrically connect integrated circuit chips mounted on the module. Both single chip modules and multiple-chip modules are known in the art. Such modules are made typically of a number of individual ceramic or glass ceramic sheets that have been fused together to form the module. Solder balls connect one or more integrated circuit chip electrically and mechanically to the top surface of the module.

In manufacturing the module, individual layers or sheets are formed with desired wiring patterns and/or vias. Ceramic or glass ceramic sheets which are commonly used have desired wiring patterns formed on their surface and via openings formed by a punch. The sheets are stacked and sintered to fuse them together to form a solid module block. In a typical multi-layer module, the spacing among the top layer vias connecting the solder bumps to lower layers in the module is extremely close.

While generally quite satisfactory, such multi-layer ceramic modules have several temperature related shortcomings.

If an integrated circuit chip must be removed from a module as a result of failure during burn-in, or for any reason, solder bumps are often damaged in the process of removing the chip, which makes replacement of the chip difficult and costly or impossible.

In addition, the coefficients of thermal expansion of the integrated circuit chip and the ceramic module itself are usually different. This limits the maximum chip size (distance from a neutral point) and limits the operational life of the connectors due to the mechanical strain caused by differential thermal expansion as the temperature of the module changes in power on, power off machine cycles.

In a multi-chip module, all chips on the module should be within a rather narrow temperature range during operation. In prior art modules, this need to keep all chips within a relatively narrow temperature range limited module design flexibility, since high-power chips could not be used with low-power chips where local heating in the region of the high-power chip would create a temperature differential outside an acceptable range between high-power and low-power chips.

There have been proposals in the prior art addressing some of these issues in the context of relatively simple chips mounted on printed circuit boards.

U.S. Pat. No. 5,010,233 to Henschen et al. discloses a heater secured to or embedded in a circuit board. The heater is selectively energizable to melt solder in a connection or disconnection operation. The heater is spaced from circuit board contact pads by circuit board structure material that transmits the generated thermal energy to the contact pads to melt solder or other fusible material.

U.S. Pat. No. 4,374,316 to Inamori et al. discloses a semiconductor integrated circuit support on which a heating element is provided. The support comprises a package, a printed circuit board, a mother board, or the like, for supporting a semiconductor integrated circuit, which includes devices such as transistors. The heating element is capable of heating the whole, or a required part only thereof, so that the semiconductor integrated circuit is preheated to a temperature required for its normal operation with precision and stability.

U.S. Pat. No. 4,769,525 to Leatham discloses a circuit package, or other device, mounted on a printed circuit board, or other substrate, with an electrically conductive sinuous resistor wire structure therebetween in a space filled with adhesive. When the adhesive is set the package is held in place. When removal is desired, current is passed through the sinuous wire structure to soften the adhesive to permit removal of the package without damage to the package or the board.

U.S. Pat. No. 4,506,139 to Daughton discloses a hybrid or integrated circuit chip with a heating means integral therewith. The heating means is made accessible for application of an external electrical energy source so as to permit removal of the circuit chip after previously being soldered to a support structure or permit soldering of a circuit chip to the support structure.

U.S. Pat. No. 4,582,975 to Daughton discloses a method for removing a hybrid or integrated circuit chip soldered to a support structure. An electrical energy source is applied to the hybrid circuit chip for raising the temperature of the circuit chip sufficiently so as to melt the solderable material which interconnects the chip to the support structure. When the solderable material is melted, the circuit chip may then be removed from the support structure.

U.S. Pat. No. 3,584,189 to Marcous discloses a self-regulating heater for integrated circuits and the like which are removably carried in a connector assembly. The heater includes a heating element composed of material having a positive temperature coefficient of resistance. The heating element is pressed against a heater plate. A rim of the heater plate is supported upon the margin of an opening or window in the housing so that an integrated circuit unit or the like mounted on the housing, is placed in heat-exchange relationship with the heater plate, whereby the temperature of the integrated circuit unit or the like is stabilized. Interchange may readily be made between various heater elements to provide desired changes in the regulated temperature.

U.S. Pat. No. 3,440,407 to Goltsos et al. discloses a circuit board having a grid of resistance heating elements embedded in an insulating substrate. The heating of the board can be localized by severing the grid at strategic points. A thermostat is orientated to control the temperature at selected portions of the board.

U.S. Pat. No. 4,481,403 to Del Monte discloses a controlled heater apparatus for selectively heating a solid state circuit chip and the substrate upon which it is mounted by a solder bump, so as to cause substantially equal expansion and contraction in the chip and substrate to relieve stress on the connecting solder bump.

It will be appreciated that these prior art proposals address some issues, such as chip removal for example, addressed by this invention. However, the context of these prior art proposals is different than that of a multi-layer ceramic module with its dense top surface via pattern.

SUMMARY OF THE INVENTION

One object of this invention is the provision of a multi-layer ceramic module that can heat and thereby soften solder bumps, thus facilitating removal of integrated circuit chips from the module and the reuse of solder pads for a replacement chip.

Another object of the invention is the provision of a multi-layer ceramic module in which the temperature difference can be reduced between the temperature of the module in its on state and its off state.

A further object of the invention is to provide improved flexibility in the design of multi-layer ceramic modules by providing a more uniform distribution of temperature across the surface of the module in its operating state.

A still further object of the invention is the provision of module that meets the above-stated objects without change to the module technology.

Briefly, this invention contemplates the provision of a multi-layer module that has incorporated therein a heat generating sheet comprised of film resistor that, preferably, follows a continuous path in the spaces between the via openings in a sheet. The heater sheet with the film resistor is located at a convenient depth from the top surface of the module, preferably at a depth in the module where there has been sufficient fan-out of the top surface connectors so that the via spacing is sufficient to accommodate the film resistor. A temperature responsive controller regulates the film resistor current in order to regulate the temperature at the surface of the module. By maintaining an elevated temperature at the top surface of the module, the chips in a multi-chip module will be maintained within a narrow temperature range despite any differences in heating of local area due to differences in power dissipation of the chips.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
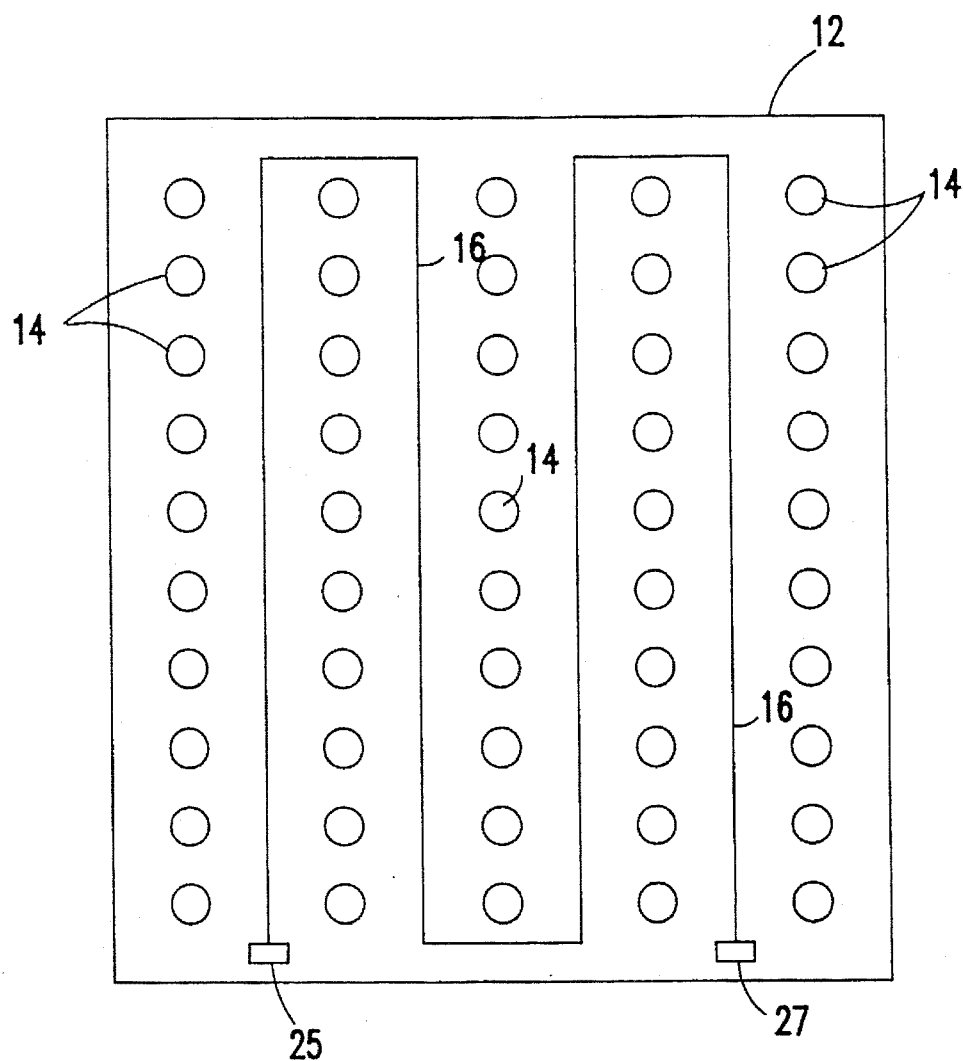
FIG. 1A is an illustrative plan view of one embodiment of a heater sheet in accordance with the teachings of this invention.
Figure 1B:
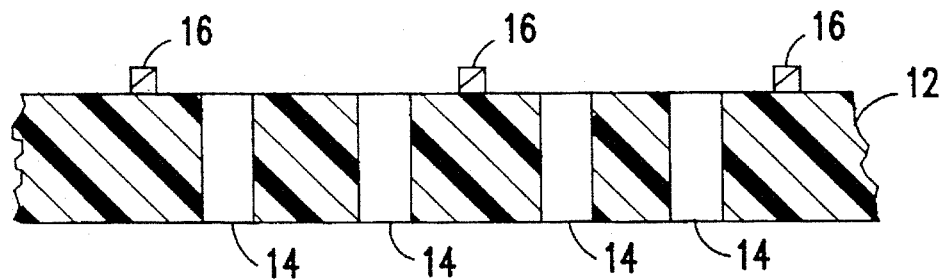
FIG. 1B is a fragmentary sectional view of the heater sheet illustrated in FIG. 1A.

Referring now to FIGS. 1A and 1B, a heater sheet 12 has a pattern of via openings 14 formed therein. In a preferred embodiment of the invention the module is a ceramic or glass ceramic module and the heater sheet 12 is a ceramic or glass ceramic sheet referred to in the art as a green sheet. A film resistor 16 follows in a continuous path between the via openings 14. The width of the film resistor 16, in the plane of the heater sheet 12, is sufficiently narrow that the film resistor fits between the via openings 14, as shown. Preferably, the film resistor 16 follows a looping, serpentine path through the via opening pattern, also as illustrated in FIG. 1A. One end of the film resistor 16 is connected to a pad 25 and its other end is connected to a pad 27. As will be appreciated by those skilled in the art, a heating current power supply can be connected to the ends of the thin-film resistor 16 by using a via chain to provide a connection path from the top, or preferably bottom, surface of the module to the pads 25 and 27.

Preferably, the heater sheet 12 is located at a depth from the top surface of the module where there has been sufficient fan out from the very densely spaced top surface solder bump connection pads and their associated vias, to a level where there is more separation between vias and associated capture pads. In addition, the level at which the heater sheet 12 is located is preferably sufficiently deep in the module so that the heater sheet 12 vias provide only a straight-through connection from one side of the sheet to the other, which simplifies its assembly and integration into the module.

In one specific embodiment of the invention particularly well suited for use in a multi-layer module of laminated ceramic sheets, the film resistor 16 is formed by screening a conductive paste (e.g., a molybdenum paste) onto the sheet 12 after via openings 14 have been punched into the sheet. It should be noted that a film resistor formed by such a screening process, results in a relatively thick-film resistor.

It should also be noted that a conductive paste, such as a molybdenum paste, is widely used as a material in via conductors and that the film resistor 16 and the via conductors can be formed in a single screening step, if desired. Capture pads for via conductors in via openings 14 can be formed subsequently in an over layer in accordance with prior art process steps.

Figure 2:
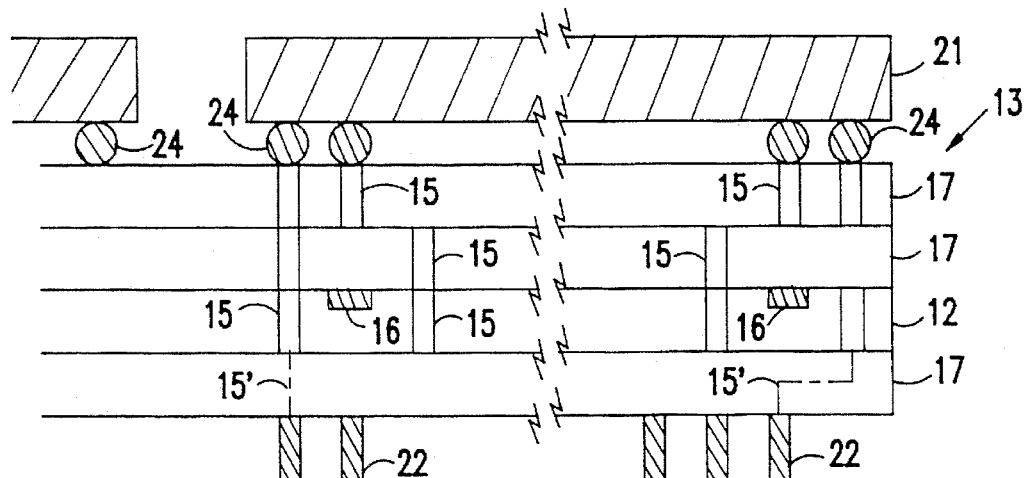
FIG. 2 is a fragmentary, section view of a module incorporating a heater sheet in accordance with the teachings of this invention.

Referring now to FIG. 2, a heater sheet 12, is incorporated into an otherwise conventional multi-layer integrated circuit chip module indicated by the general reference number 13. In a thirty-layer module, the heater sheet 12 would typically be located about midway in the module 13.

As will be appreciated by those skilled in the art, the otherwise conventional module includes various additional signal and power wiring layers 17, vias 15 forming via chains to provide connections among the layers and connections to the top and bottom surfaces of the module. As these various layers are conventional, a single reference number 17 has been used, although it will be appreciated that, in fact, all the layers are not functionally or structurally identical. Further, it will be appreciated that all of the module layers, including heater layer 12, are sintered after they have been formed in a stack in order to fuse together the layers into a solid block.

As mentioned above, except for the inclusion of heater sheet 12, the module 15 can be of any suitable prior design and makeup. It would include, on its top surface, a metallization pattern (not shown) and power pins and signal pins 22 extending from its lower surface. An integrated circuit chip 21 is electrically and mechanically connected to the module 15 by means of solder bumps 24.

Via chains (indicated schematically in FIG. 2 by dashed lines labeled 15') connect the capture pads 25 and 27 (not shown in FIG. 2) on heater sheet 12 to either pads (not shown) on the top surface of the module or to a pair of pins 22 extending from the lower surface of the module. The pins 22, or the top surface pads, can be used to connect a heating current source to the film resistor 12.

By way of example, a square heater sheet 12 that is 50 millimeters on each side intended for use in a single chip, multi-layer module, typically would have a film resistor 16 about 9 centimeters in total length. The total length is limited by the available surface of the sheet to form the film resistor. The resistance of the film resistor is typically on the order of 0.34 ohms/cm. A joule heating effect ($I^2R$) up to 12 watts can then be generated with a current that does not exceed 2 amperes. Twelve watts can generate a temperature elevated about 72° C. above ambient for a single chip module. It should be noted that the depth of the heater sheet 12 in the module does not appreciably effect the temperature of a chip on the top of the module. Even with the heater sheet 12 located midway in a thirty-layer module, the thermal resistance between the film resistor 16 and the chip 25 is only about 0.5° C. per watt, or less. Usually the temperature difference between the film resistor 16 and a chip 21 will not exceed 5° C.

A multi-layer module that includes a heater sheet 12, in accordance with the teachings of this invention, provides a number of advantages in both single-chip and multiple-chip embodiments. A module with a heater sheet 12 can maintain either a single chip in a single-chip module or multiple chips in a multiple-chip module at a desired temperature elevated above ambient when the machine power is off, in order to reduce thermal cycling of the chip or chips and the module. This will reduce connection failure. The heater can also be turned on to soften solder bumps 24.

Figure 3:
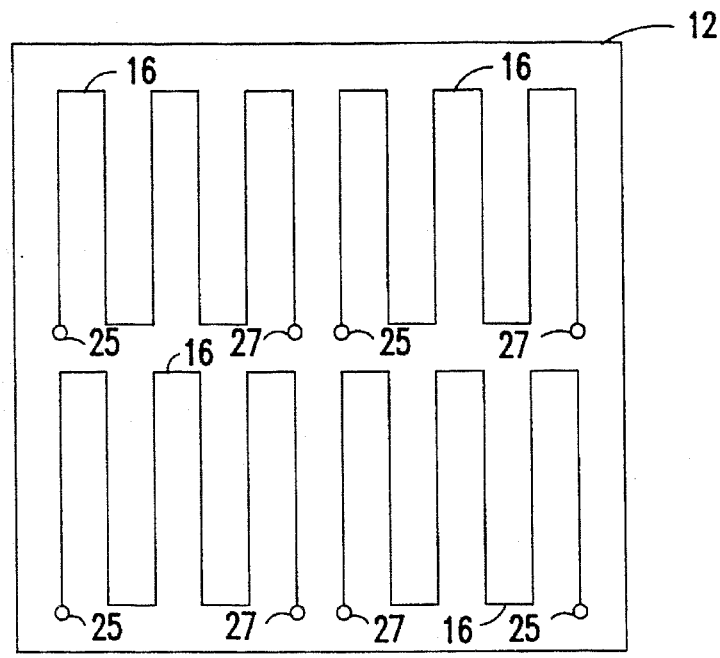
FIG. 3 is a plan view of a heater sheet with a plurality of independent film heaters.

In addition, as illustrated schematically in FIG. 3, a sheet 12 can be provided with a number of independent film resistors 16; FIG. 3 shows four independent film resistors as an example. The vias 14 have not been shown in FIG. 3, but would, of course, be formed in the sheet 12 as illustrated in FIG. 1. Multiple independent film resistors, such as illustrated in FIG. 3, can be used in a multi-chip module, and each film resistor 16 can be provided with an independent heater current coupled from a suitable power source to the end terminals 25 and 27 of each film resistor 16. If desired, each film resistor 16 heating current can be controlled independently. The use of multiple independent film resistor heaters 16 in a multi-chip module allows operation of a multi-chip module with low chip-to-chip temperature differential, even when using chips that generate different amounts of heat in operation. This, in turn, allows operation of the chip at a low average temperature, improves reliability, and allows design flexibility by using different semiconductor technologies (e.g., bipolar and CMOS) in the same module.

Figure 4:
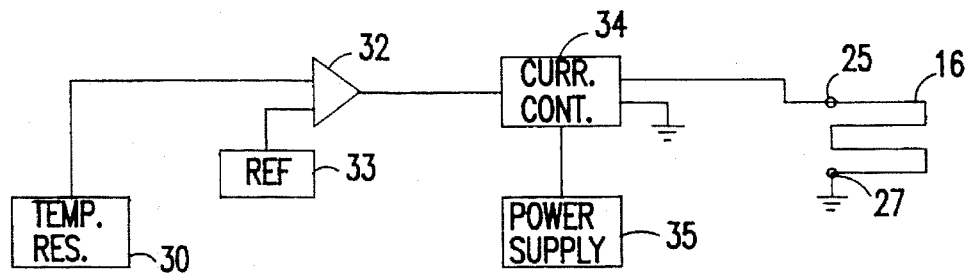
FIG. 4 is a block diagram of an exemplary embodiment of a film heater controller.

A typical temperature control circuit, of the type that may be used in the practice of this invention, is shown in FIG. 4. It includes a temperature responsive sensor 30, which may be a temperature responsive diode in the chip mounted on the module, or a suitable temperature sensor external to the chip. The output of the temperature sensor is coupled to an input of a comparator 32 whose other input is a voltage source 33 that establishes a temperature set point. The output of comparator 32 is coupled to a current controller 34 coupled to a power supply 35. The output of controller 34 is coupled to film resistor 16 and maintains the film resistor 16 current at a value prescribed by the set point input to the comparator 32.

Referring now to FIGS. 5A–5D, as an alternative to the relatively thick-film embodiment of film resistor 16 formed by screening a conductive paste onto a sheet 12 as described above, a thin-film heating resistor can be formed on a sheet 12. For example, a copper film 10 microns thick, 30 microns wide, and 10 centimeters long has a resistance on the order of 9 ohms. Copper electromigration, which is a function of temperature, current density and the cross-sectional area of the thin-film copper conductor, limits the current that could be used to generate heat in such a film resistor. However, at current levels of 2 amperes or less, copper electromigration would not be an adverse factor and thus a joule heating of up to 36 watts can be realized.

Figure 5A:
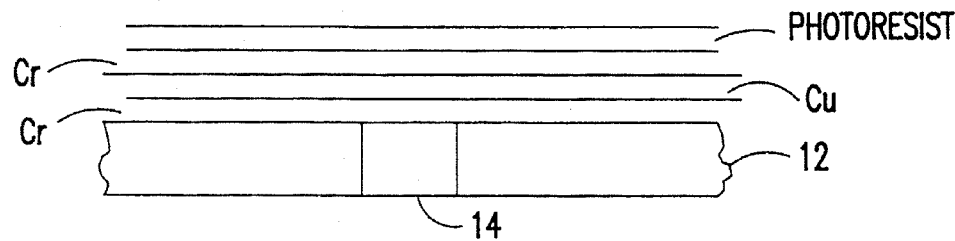
FIGS. 5A through 5D illustrate the process stages in constructing a heater sheet in accordance with an alternate embodiment of the invention.
Figure 5B:
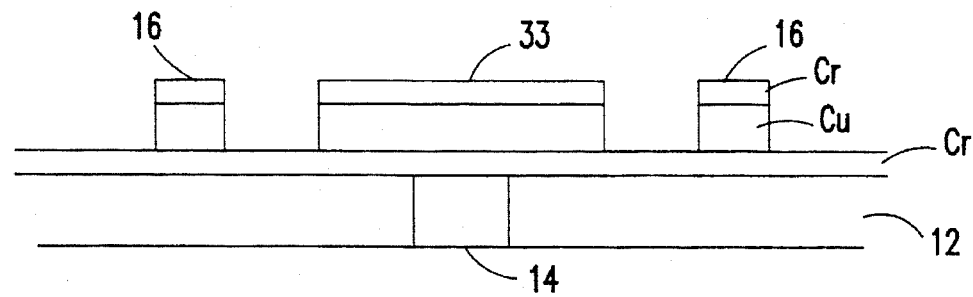
Figure 5C:
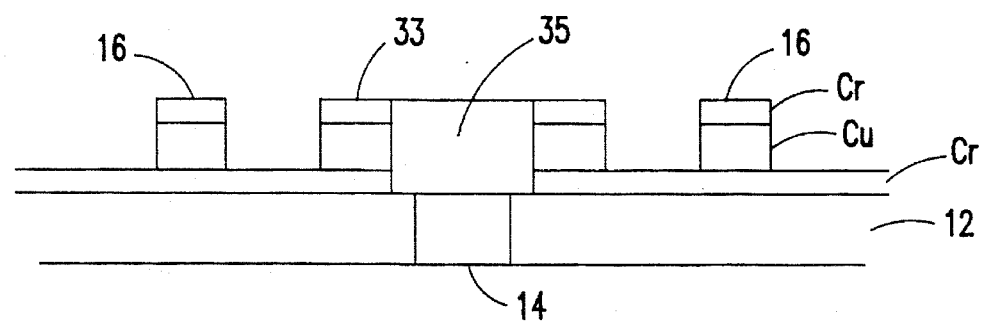
Figure 5D:
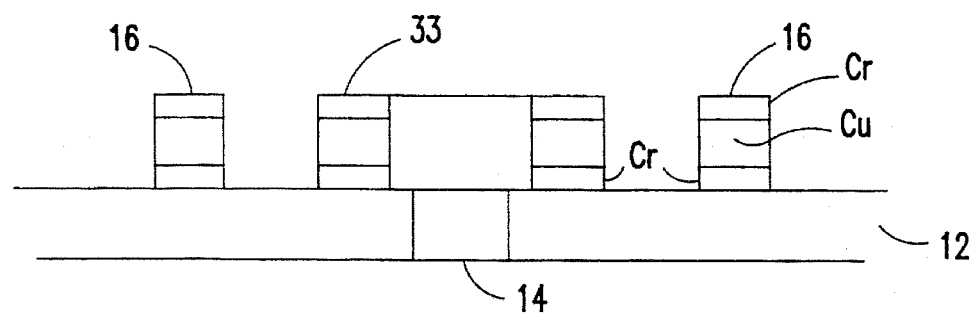

The process steps for forming a thin-film copper resistive heater are illustrated in FIGS. 5A through 5D and start with planarizing the top surface of a ceramic or glass ceramic sheet 12 after via openings 14 have been punched therein. Layers chromium, copper, and chromium then are sputtered successively over the surface of the sheet; typically the layers are Cr 200 Å; Cu 10 microns; Cr 200 Å. Next, a photoresist is formed over the Cr/Cu/Cr layer. FIG. 5A illustrates the process at this stage.

The photoresist is patterned, exposed, and developed. The developed photoresist pattern forms a pattern at the desired film resistor and in addition via capture pads for via openings 14; each pad is about 150 microns in diameter. The undeveloped resist is removed and the top chromium layer and the copper layer are then etched away in the undeveloped areas, forming a film resistor structure 16 and a capture pad structure 33. FIG. 4B shows the structure at this process stage.

Next, a solder bump wettable region 35 at the center of the capture pad 33, which overlies the via 14, is laser ablated to remove the Cr/Cu/Cr layers. FIG. 4C illustrates the structure at this stage.

Finally, the lower chrome layer is etched in the undeveloped regions, leaving a thin-film heating resistor 16 and the capture pads 33. A thin-film heater sheet 12 may be incorporated in the typical module shown in FIG. 2 as a substitute for the thick-film heater sheet.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A multi-layer module for making electrical connections to an integrated circuit chip mechanically supported on a top surface of said module, said multi-layer module comprising in combination:

a plurality of individual sheets with via patterns formed therein, said plurality of individual sheets having been stacked and fused together to form said multi-layer module, vias in said via patterns in successive layers being electrically connected to form via chains to make electrical connections among certain sheets in said module and to make electrical connections to said top surface of said module and a bottom surface of said module;

a resistive heater film formed on one of said individual sheets with via patterns formed therein, said resistive heater film following a continuous path clear of vias in said via pattern and extending from a first end of said resistive heater film to a second end of said resistive heater film, said one of said individual sheets with said resistive heater film formed thereon located in said module at a depth from said top surface of said module; and a via chain for coupling said resistive heater film to an exterior surface of said module, whereby a current source can be connected to said resistive film to elevate the temperature at the top surface of said module to a temperature for softening solder.

2. An integrated circuit module as in claim 1, wherein said resistive heater film is formed by depositing a molybdenum paste on the surface of one of said plurality of sheets.

3. An integrated circuit module as in claim 2, wherein said resistive heater film has a resistance on the order of 0.3 ohms per centimeter.

4. An integrated circuit module as in claim 1, wherein said resistive film is a thin copper film.

5. An integrated circuit module as in claim 1, wherein said path is a serpentine path.

6. An integrated circuit module as in claim 2, wherein said path is a serpentine path.

7. An integrated circuit module as in claim 4, wherein said path is a serpentine path.

8. An integrated circuit module as in claim 1, further including:

temperature sensing means to sense the temperature at the upper surface of the module; and means responsive to said temperature sensing means for controlling said current source.

9. An integrated circuit module as in claim 1, wherein a plurality of discrete resistive heater films are formed on said one of said individual sheets with via patterns formed therein.

10. An integrated circuit module as in claim 9, further including means to control the current in each of said plurality of discrete resistive heater films.

11. A method for fabricating a heater sheet for a multi-layer module, comprising the steps of:

forming a pattern of via openings in a sheet;

forming a film resistor that follows a continuous path extending along the surface of said sheet clear of said via openings, said film resistor for producing heat energy to warm the top surface of said multi-layer module to a temperature for softening solder when an electric current is passed therethrough.

12. A method for fabricating a heater sheet for a multi-layer module as in claim 11, wherein said film resistor is formed by screening a conductive paste onto the surface of said sheet.

13. A method for fabricating a heater sheet for a multi-layer module as in claim 11, wherein said film resistor is formed by depositing a thin copper layer on said sheet and subsequently etching away a major portion of said copper layer so that a remaining portion of said thin copper layer forms said film resistor.

\* \* \* \* \*